United States Patent
Chen et al.

(10) Patent No.: US 8,660,221 B2
(45) Date of Patent: Feb. 25, 2014

(54) FAST AND ROBUST AGC APPARATUS AND METHOD USING THE SAME

(75) Inventors: Jeng-Hong Chen, Temple City, CA (US); Huei-Ming Yang, San Ramon, CA (US); Chih-Ching Huang, Hsinchu (TW)

(73) Assignee: ISSC Technologies Corp., Hsinchu (TW)

( * ) Notice: Subject to any disclaimer, the term of this patent is extended or adjusted under 35 U.S.C. 154(b) by 0 days.

(21) Appl. No.: 13/517,729

(22) Filed: Jun. 14, 2012

(65) Prior Publication Data

US 2013/0336371 A1 Dec. 19, 2013

(51) Int. Cl.
*H04L 27/08* (2006.01)

(52) U.S. Cl.
USPC ........... 375/345; 375/316; 330/129; 330/254; 455/232.1; 455/234.1; 455/234.2; 455/245.1; 455/245.2; 455/246.1; 455/247.1; 455/250.1; 455/251.1; 455/253.2

(58) Field of Classification Search
USPC ........ 375/345, 316; 330/129, 254; 455/232.1, 455/234.1, 24.2, 245.1, 245.2, 246.1, 247.1, 455/250.1, 251.1, 253.2

See application file for complete search history.

(56) References Cited

U.S. PATENT DOCUMENTS

| | | | | | |
|---|---|---|---|---|---|
| 5,764,689 | A | * | 6/1998 | Walley | 375/147 |
| 6,121,244 | A | * | 9/2000 | Bruzzese | 514/31 |
| 7,184,730 | B2 | * | 2/2007 | Hughes et al. | 455/240.1 |
| 7,265,626 | B2 | * | 9/2007 | Teo et al. | 330/279 |
| 7,366,490 | B2 | * | 4/2008 | Rouphael et al. | 455/234.1 |
| 7,689,217 | B2 | * | 3/2010 | Ruelke et al. | 455/434 |
| 7,936,850 | B2 | | 5/2011 | Rodal et al. | |
| 7,995,979 | B2 | | 8/2011 | Lu et al. | |
| 8,107,565 | B2 | | 1/2012 | Li et al. | |
| 2004/0259510 | A1 | * | 12/2004 | Audinot et al. | 455/136 |

* cited by examiner

*Primary Examiner* — Siu Lee
(74) *Attorney, Agent, or Firm* — Birch, Stewart, Kolasch & Birch, LLP

(57) ABSTRACT

The present invention discloses apparatus and method for fast and robust automatic gain control (AGC). By using the power statistics and/or the amplitude statistics of multiple pairs of signed ADC outputs, the additional gain control can be determined and included in a statistics-aided AGC to successfully complete the AGC function for a received signal having a dynamic range up to 100 dB within a few micro-seconds.

11 Claims, 10 Drawing Sheets

| ADC Outputs | Signed ADC Output $I_i$ or $Q_i$ |
|---|---|
| 7 | $3 = MSB_{p1} \equiv 2^{N-1}-1$ |
| 6 | $2 = MSB_{p2} \equiv 2^{N-2}$ |
| 5 | $1 = MSB_{p3} \equiv 2^{N-3}$ |
| 4 | 0 |
| 3 | $-1 = MSB_{n3} \equiv -2^{N-3}$ |
| 2 | $-2 = MSB_{n2} \equiv -2^{N-2}$ |
| 1 | $-3$ |
| 0 | $-4 = MSB_{n1} \equiv -2^{N-1}$ |

(1) Simple Power and Amplitude Indicators for Signal Power too High:

(1a) Power Indicators:

$$P_{msb\_k\_sat} = \begin{cases} True, & \text{if } P_i \geq P_{msb\_k} \\ False, & \text{otherwise} \end{cases} \text{ for } 1 \leq k \leq N$$

(1b) Amplitude Indicators:

$$MSB\_1\_sat = \begin{cases} True, & \text{if } (I_i = MSB_{p1} \text{ or } I_i = MSB_{n1}) \text{ or } (Q_i = MSB_{p1} \text{ or } Q_i = MSB_{n1}) \\ False, & \text{otherwise} \end{cases}$$

$$MSB\_k\_sat = \begin{cases} True, & \text{if } (I_i \geq MSB_{pk} \text{ or } I_i \leq MSB_{nk}) \text{ or } (Q_i \geq MSB_{pk} \text{ or } Q_i \leq MSB_{nk}) \\ False, & \text{otherwise} \end{cases} 2 \leq k \leq N$$

(2) Simple Amplitude Indicators for Signal Power too Low:

$$MSB\_k\_null = \begin{cases} True, & \text{if } (I_i < MSB_{pk} \text{ and } I_i > MSB_{nk}) \text{ and } (Q_i < MSB_{pk} \text{ and } Q_i > MSB_{nk}) \\ False, & \text{otherwise} \end{cases}, 1 \leq k \leq N$$

Note: User can define the appropriate "and/or" conditions differently in each application.

Here, $$P_{msb\_1} \equiv 2 \cdot (2^{3-1}-1)^2 = 18$$
$$P_{msb\_2} \equiv (2^{3-2})^2 + (2^{3-2})^2 = 8$$
$$P_{msb\_3} \equiv (2^{3-3})^2 + (2^{3-3})^2 = 2$$

FIG. 6

| For M=8 pairs of N-bit ADC samples, $I_i$ and $Q_i$ |||
|---|---|---|
| Conditions | Additional LNA/VGA Gain Adjustments | Reasons |
| (I). At least 6 $P_{msb\_1\_sat}$ = True | Reduce Gain by 15 dB | Too much LNA+VGA Gain (if both I and Q are saturated) |
| (II). At least 6 $MSB\_1\_sat$=True | Reduce Gain by 10 dB | Too much LNA+VGA Gain (if I and/or Q are saturated) |
| (III). All $MSB\_4\_null$ = True | Increase Gain by 12 dB | Too small LNA+VGA Gain (signal power is at least 18 dB smaller than $P_{msb\_1}$) |
| (IV). All $MSB\_3\_null$ = True | Increase Gain by 6 dB | Too small LNA+VGA Gain (signal power is at least 12 dB smaller than $P_{msb\_1}$) |
| (V). All $MSB\_1\_sat$ = False but At least 5 $MSB\_2\_sat$ = True | Reduce Gain by 2 dB | No MSB_1 saturation but most of the samples are quite large |
| (VI). All $MSB\_1\_sat$ = False but At least 6 $P_j \geq P_D$ | Reduce Gain by 2 dB | No MSB_1 saturation but most of the sampled powers are quite large |
| ..... | ..... | ..... |

FIG. 7

| For M=16 pairs of N-bit ADC samples, $I_i$ and $Q_i$ | | |
|---|---|---|
| Conditions | Adjust LNA and/or VGA gains | Reasons |
| (I). At least 12 $MSB\_1\_sat$=True | Reduce Gain by 10 dB | Too much LNA+VGA Gains (if I and/or Q are saturated) |
| (II). All $MSB\_4\_null$=True | Increase Gain by 12 dB | Too small LNA+VGA Gains (signal power is at least 18 dB smaller than $P_{msb\_3}$) |
| (III). All $MSB\_3\_null$=True | Increase Gain by 6 dB | Too small LNA+VGA Gains (signal power is at least 12 dB smaller than $P_{msb\_3}$) |
| (IV). All $MSB\_1\_sat$=False but At least 10 $MSB\_2\_sat$=True | Reduce Gain by 2 dB | No MSB_1 saturation but most of the samples are too large if checking the 2$^{nd}$ MSB of ADC outputs. |
| (V). All $MSB\_1\_sat$=False but At least 12 $P_i \geq P_D$ | Reduce Gain by 1 dB | No MSB_1 saturation but most of the sampled powers are too large |
| …… | …… | …… |

FIG. 8

FAST AND ROBUST AGC APPARATUS AND METHOD USING THE SAME

BACKGROUND OF THE INVENTION

1. Field of the Invention

The present invention relates to fast and robust apparatus used for wireless communication systems, such as but not limited to wireless local area networks (WLAN), and in particular to a fast and robust apparatus having an automatic gain control (AGC) gain setting.

2. Background

The present invention relates to wireless communication systems, such as but not limited to wireless local area networks (WLAN), and in particular to an 802.11a/b/g/n receiver base-band modem that provides a fast and robust automatic gain control (AGC) function for various RF transceiver ICs. In a typical WLAN environment, the received signal strength can vary with a dynamic range up to 100 dB depending on the distance between a transmitter and a receiver. An Automatic Gain Control (AGC) circuitry has been widely used in WLAN receivers to optimize its range performance.

While implemented, a typical WLAN transceiver consists of three chips, one power amplifier (PA) chip, one RF transceiver chip, and one integrated base-band (BB) and Medium Access Control (MAC) chip. To further lower down the total cost of a WLAN transceiver, integration of the PA chip into the RF transceiver chip has been achieved. Development effort in accomplishing a single-chip WLAN transceiver implementation has also been announced. FIG. 1 shows a functional block diagram for a wireless transceiver, which includes a direct-conversion (also known as zero-IF) receiver, for WLAN applications. At the highest level, it contains four functional blocks: an antenna 11, an antenna switch 12, a transmitter 20 and a receiver 10. While transmitting, the antenna switch position is such that a transmitter is connected to the antenna and the RF receiver is normally turned off to save power. While receiving, the antenna switch is positioned such that the RF receiver is connected to the antenna, and the transmitter is normally turned off. For all the discussions below, one can assume that the transceiver is in the receiving mode and the transmitter is turned off.

As is shown in FIG. 1, a typical zero-IF receiver 10 consists of a Low Noise Amplifier (LNA) 13, a pair of mixer 14a and 14b, a pair of channel selection filter 17a and 17b, and a pair of multiple stages of Variable Gain Amplifiers (VGA's) 18a and 18b. The LNA 13 is used to amplify a weak received signal with minimum distortion. In other words, the LNA Block 13 is used to enhance the sensitivity of the receiver. To provide the best sensitivity, a LNA stage provides a gain about 15 dB with a noise figure (NF) between 1.5 to 2.5 dB. Multiple stages of LNA's can be used to further enhance the receiver sensitivity in the presence of a weak received signal.

In the presence of a very strong signal, it is usually desirable to turn off some or all stages of the LNA's if multiple LNA's are used. The output of the LNA 13 is connected to a pair of mixers 14a and 14b. To keep the fidelity of the received signal, two mixers are required to provide an in-phase and a quadrature phase base-band signals. One mixer 14a, which takes the carrier generated by the synthesizer 16 as one input and the LNA 13 output as another input, converts the received Radio Frequency (RF) signal to a base-band in-phase signal (also known as I-channel) as its output. While the other mixer 14b, which uses a 90-degree phase-shifted carrier 15 as one input and the LNA 13 output as another input, to convert the received RF signal to a baseband quadrature-phase signal (also known as Q-channel) as its output. In what follows, the received in-phase and quadrature signals will be referred as I-channel and Q-channel signals, respectively. From now on, the processing of both I-channel and Q-channel signals is essentially the same. So it is sufficient to describe the processing of the I-channel signal.

For the I-channel signal, a low-pass Filter 17a is applied to the corresponding mixer output to filter out the adjacent channel interferences and the unwanted mixer output at twice the RF signal frequency. The I-channel filter output is connected to the Variable Gain Amplifiers (VGA) 18a for gain adjustment. In this diagram, each VGA 18a contains two Variable Gain Amplifier stages 19a and 19b with their gain controlled by the AGC control signals (as shown in FIG. 1) generated by AGC 22. A designer may use 3 or more VGA stages to implement the VGA function 18a. As its name shows, each VGA stage 19a or 19b allows one to adjust its control voltage for providing variable gain to its input signal. The output of the VGA 18a is connected to an analog-to-digital converter (ADC) 21a of the base-band modem 40. The ADC 21a digitizes and coverts an input signal to the signed ADC samples from 210a to facilitate further processing of the received signal by the base-band demodulator processor 23 in digital domain. Detail operations will be presented later.

To fully utilize the dynamic range of an ADC, the input to an ADC needs to be maintained at or close to an optimal level. This is achieved by the AGC circuitry 22. The AGC circuitry, most commonly implemented in the base-band demodulator receiver 40, estimates the received signal strength and then properly adjusts the modes of the LNA 13 and the gains of the VGA's 18a and 18b in the RF receiver. The MUX 2220 is used to select a digital or analog AGC control signal according to its RF Receiver 30. If the AGC gain is controlled by an analog signal, a digital-to-analog converter (DAC) 2210 is required to convert the digital AGC control signal to the correspondent analog control signal.

For an 802.11a/b/g/n receiver to achieve optimal performance, this function needs to be accomplished in about 2 micro-seconds. This requirement makes the AGC function a challenge with a received signal strength variation of up to 100 dB.

More details on the AGC function will be presented below. To properly support the AGC function, one can use multiple stages of VGA's 18a and 18b. The total gain of the VGA's is usually controlled by the AGC 22 in the base-band demodulator 40. Dependent on its control voltage, a typical VGA stage can provide a gain from 0 dB to around 25 dB. With two to three stages of VGA's, a total received signal dynamic range around 75 dB can be supported. This is insufficient to support a dynamic range of up to 100 dB. Therefore, some RF transceivers provide either (1) means for switching off its low noise amplifier (LNA) and/or an intentional mis-matched antenna switch connection or (2) multiple switch-able stages of LNA's to extend the receive signal dynamic range further.

For IEEE 802.11g or 802.11n WLAN application, it is required to detect the signal presence and determine the signal strength (for AGC to settle close to its final gain), and turn on or off the LNA stages (or, equivalently in a two-stage LNA design, set the LNA gain to maximum by turning on both LNA stages, medium by turning off one LNA stage, or minimum by turning off both LNA stages) as necessary, all within about 2 micro-seconds. Hence, the implementation of the AGC circuitry becomes even more critical to an 802.11b, 802.11g, 802.11a, or 802.11n WLAN receiver.

For a detailed discussion, a traditional AGC 22 is shown in FIG. 2. Since the ADC digitizes the received analog waveform and provides unsigned integers as outputs, the paired ADC outputs from both channels are coupled into a pair of Converters 210a and 201b. The signed ADC output samples are obtained in 210a and 210b by subtracting the middle value of an N-bit ADC's dynamic range from the unsigned ADC output samples. After the paired Converters, the signed outputs of the i-th received samples (which are denoted as $I_i$ and $Q_i$) are coupled into the Power Detector 224. The measured power ($P_i$) of the i-th paired samples is then compared with the desired digitized signal power ($P_D$). $P_D$ is typically chosen such that the full dynamic range of the ADC can be used. The multiplier 222 is used to control the AGC loop gain, which has an adjustable gain, k. The accumulator 228 uses an adder 228a and a delay 228b to track the history of accumulated AGC power error. The accumulator 228 output is an appropriate digital gain value, $_{linear}$. Since VGA and LNA gains are typically adjusted in dB while the digital value $_{Glinear}$ is evaluated in "linear" domain, a VGA/LNA gain mapping 223 typically takes the digital value $_{linear}$ and converts into to proper LNA and VGA gain control signals.

One may measure and average more pair of I/Q samples before the subtractor 226 for a better power measurement in statistics. However, the more samples are measured, the slower the AGC gain is adjusted. The other drawback of this AGC operation is from the saturated samples. In order to be able to receive the smallest signal, the AGC 22 is initially set to have the maximum gain when no signal was present (noise only). For a better explanation, a few I or Q waveforms, when the ADC is allowed to have unlimited number of bits, after the Converters 210a and 210b are shown in FIG. 3. Two dashed horizontal lines show the levels at which the waveform samples would have been clipped for an N-bit ADC. When a waveform sample was clipped, an N-bit ADC was called "saturated" below. For a pair of N-bit ADCs, the dynamic signal range (in dB) is proportional to the bit-number, N. However, the greater N is, the higher cost is to build this pair of ADCs. For a practical WLAN system, the bit number N used is much smaller than its signal dynamic range (around 100 dB). Therefore, the dynamic range of an incoming signal (depending upon the distance between a transmitter and the receiver) may be 30 dB or greater in power than that of a pair of N-bit ADCs. With the AGC gain set at maximum while waiting for a WLAN signal, the presence of a WLAN signal will typically cause most or all N-bit ADC outputs being saturated, as shown in FIG. 3a and FIG. 3b. For explanation simplicity, it is assumed that the number of ADC output saturations in Cases A and B is similar. Since a pair of saturated ADC output does not provide the information as to how big the input signal power is compared to the maximal ADC dynamic range, the estimated AGC power errors are insufficient for the AGC block to determine the correct AGC gain, which should be a few dB lower in Case A, and quite a few dB lower in Case B. A greater reduction in AGC gain is desirable for Case B, while the same gain reduction would have caused the received signal to be too small at the output of the ADC for Case A.

When AGC sometimes over-reacts, it can cause the digitized samples to be much smaller such as shown in FIG. 3c and FIG. 3d. The conventional AGC algorithm applied for these cases can be explained as follows. For a faster convergence, a higher loop gain 222 can cause AGC gain oscillation and the AGC loop may become unstable. On the other hand, a smaller loop gain 222 will take a significant time for the AGC block to converge to the desired AGC gain. Intuitively, one may count the statistics of the saturation of ADC outputs to aid the AGC block. In cases of FIG. 3c and FIG. 3d, if one counts not only the saturations of the ADC outputs but also the "saturations" of several other power levels as shown in FIG. 3c and FIG. 3d, a better estimate of received signal power can be obtained.

A traditional AGC loop (without saturation-detection aided algorithm) as shown in FIG. 2 requires significant time for AGC gain to converge and hence is not suitable for applications like WLAN. Typically, the loop gain is set to be small for a slow but smooth AGC gain convergence. The power error of ADC output samples are averaged for a sufficient time for a better power estimate in statistics. When a higher AGC gain is used for a fast converge AGC loop, the AGC gain may be oscillating too much and the system performance is degraded. A slow convergence AGC loop is not suitable for a system requires AGC gain to converge within a few micro-seconds, e.g., a WLAN packet with very short preambles (or short training sequence). The aided algorithm should be used to shorten the AGC convergence time.

A traditional saturation-detection aided AGC algorithm uses the saturated ADC samples only, i.e., 0 and $2^N-1$ for an N-bit ADC. However, a 802.11a/g/n WLAN signal uses OFDM modulation which can have a peak-to-average power ratio around 10 dB. For such a modulated signal, a back-off of more than 6 dB is typically required so the signal is not clipped (distorted) going through the ADC. In this case, the ADC saturation in statistics is a rare event and it is not a useful indication to determine if the AGC gain is too high or not. In addition, the ADC saturation indicates the AGC gain may be too high but there is no aided algorithm for the cases when the AGC gain is too low. Therefore, it is faster and easier to adjust the AGC from high gain to low gain than to adjust the AGC from low gain to high gain for a traditional saturation-detection aided algorithm. Furthermore, a traditional Receive Signal Strength Indicator (RSSI) aided AGC algorithm requires significant time for an accurate RSSI estimate; a drawback for a WLAN system which requires a quick and fast AGC convergence. In addition, a long RSSI measurement time results in a slow AGC gain adjustment, and hence less time remains for a traditional AGC loop (FIG. 2) which is slow but precise in gain convergence, a desirable property for AGC gain fine-tuning Furthermore, since a lock-up time (with fixed AGC gain) is required for an accurate RSSI measurement, this lock-up time can cause the loss of a WLAN packet with a very short preamble or training sequence, in case the receiver gets into a false alarm mode immediately before the arrival the packet.

This invention application is focused on the AGC 22 which is part of the receiver function. The overall amplifier gain provided by a receiver (including LNAs and VGAs) is denoted as "AGC gain" in this application. In general, the higher the received signal power, the smaller the AGC gain is provided by the receiver. The AGC 22 is used to measure the received signal power and apply an appropriate AGC gain (by changing LNA on/off states and/or VGA gains) so the received signal is appropriately amplified and the outputs of VGAs 18 can fully utilize the designed dynamic range of an ADC. If the AGC gain is too high, the ADC will be saturated and the ADC output signal is distorted. If the AGC gain is too small, the ADC outputs are too small (a waste of the ADC's dynamic range), which can cause the baseband demodulator processor to decode the data incorrectly. In summary, the system performance will be degraded in both cases. In practice, the AGC function needs to correctly estimate the received signal power of a wideband 802.11a/b/g/n signal within a few micro-seconds by adjusting the VGA gains and, if needed, switching off one or more LNA stages which has a settling time of a couple hundreds of nano-seconds each to achieve a receiver dynamic range around 100 dB. To implement a fast-and-precise AGC algorithm in a few micro-seconds for a receive signal with a 100 dB dynamic range is a great challenge for any WLAN receiver. Therefore, the purpose of this invention application is to provide a few simple-fast-and-reliable aided AGC algorithms for AGC 22 during coarse and fine AGC tunings.

This invention presents an innovative statistics-aided AGC algorithm based on the statistics of the ADC outputs. The benefit of using this digital AGC algorithm is multifold: (1) it provides a simple aided algorithm to be appended to a traditional AGC block 22, (2) it provides a faster and more robust AGC convergence than a tradition aided AGC algorithm, and (3) it provides a generic algorithm that can be applied to the front-end of various RF receivers, which typically are required to detect a signal with up to 100 dB power variations.

U.S. Pat. No. 7,936,850, issued to Eric Rodal et al. entitled "Method and apparatus for providing a digital automatic gain control (AGC)" discloses a logarithmic analog-to-digital converter for sampling the analog RF signals, a FIR filter for filtering the digitized signals, a re-sampler for re-sampling the digitized signals, and an automatic gain control circuit. This patent application is focused on an automatic gain control function which controls the resampling of the first plurality of bits to form the second plurality of bits in accordance with an automatic gain control signal.

According above discussions, it need a method and apparatus to overcome the disadvantage of the prior art.

BRIEF SUMMARY OF THE INVENTION

It is an objective of the present invention to provide a fast and robust AGC apparatus. By using the power statistic or the amplitude statistic of the pairs of N-bit I and Q channel unsigned ADC outputs, an additional AGC gain can be determined to ensure a fast and robust AGC implementation which provides the LNA on/off and the VGA gain control signal.

It is another objective of the present invention to provide an automatic gain control (AGC) method using amplitude statistics of I and Q channel samples.

It is another objective of the present invention to provide an automatic gain control (AGC) method using power statistics of I and Q channel samples.

It is another objective of the present invention to provide a wireless communication transceiver with an automatic gain control (AGC).

To achieve the above objective, the present invention provides a fast and robust automatic gain control (AGC) apparatus with an additional AGC gain adjustment ($\Delta_{Aided}$) comprising: a power detector, a statistics-aided AGC algorithm unit, a subtractor, an average unit, an adder, a multiplier, an accumulator, and a LNA AND VGA control mapping unit. The first signed signal ($I_i$) is provided by a first analog-to-digital converter. The second signed signal ($Q_i$) is provided by a second analog-to-digital converter. The power detector, electrically connected to the first analog-to-digital converter and the second analog-to-digital converter, is used for providing a plurality of measured power ($P_i$), where $P_i$ is equal to the sum of squares of the first signed signal ($I_i$) and the second signed signal ($Q_i$).

The statistics-aided AGC algorithm unit, electrically connected to the first analog-to-digital converter, the second analog-to-digital converter and the power detector, is used for determining an additional AGC gain adjustment ($\Delta_{Aided}$) according to the amplitude statistics of the plurality of M pairs of the first signed signal ($I_i$) and the second signed signal ($Q_i$), and/or the power statistics of the corresponding plurality of measured power ($P_i$), wherein M is an integer from 1 to 100;

The subtractor, electrically connected to the power detector, is used for evaluating a power differences between a desired received signal power ($P_D$) and each of the plurality of measured power ($P_i$) and providing a plurality of AGC power error signals. The average unit, electrically connected to the subtractor, is used for averaging the plurality of AGC power error signals and providing an average AGC power error signal. The adder, electrically connected to the average unit and the statistics-aided AGC algorithm unit, is used for providing a gain adjustment by adding the additional AGC gain adjustment ($\Delta_{Aided}$) to the average AGC power error signal. The multiplier, electrically connected to the adder, is used for controlling a AGC loop gain by an adjustable gain (k). The accumulator, electrically connected to the multiplier, is used for tracking the history of accumulations of the average AGC power error signal and providing an appropriate digital gain value ($G_{linear}$). The LNA AND VGA control mapping unit electrically connected to the accumulator is used for converting the appropriate digital gain value ($G_{linear}$) into a LNA AND VGA gain control signal.

To achieve another objective, the present invention provides an automatic gain control (AGC) method using amplitude statistics, comprising steps of: Step1: determining the amplitude statistics including the number of a plurality of ADC Most-Significant-Bit (MSB) saturations, the number of a plurality of ADC k-th Most-Significant-Bit (MSB) saturations and the number of ADC k-th Most-Significant-Bit (MSB) non-saturations within a plurality of M pairs of the first signed signal ($I_i$) and the second signed signal ($Q_i$), Step2: determining an additional AGC gain adjustment ($\Delta_{Aided}$) according to the amplitude statistics obtained in Step1.

According to one aspect of the present invention, the amplitude statistics further comprises cases of: case1: if one or both of the amplitudes of the first signed signal ($I_i$) and the second signed signal ($Q_i$) is equal to $2^{N-1}-1$ or $-2^{N-1}$, the number of a plurality of ADC Most-Significant-Bit (MSB) saturations is increased by one, case2: if one or both absolute values of any pair of the amplitudes of the first signed signal ($I_i$) and the second signed signal ($Q_i$) are greater than or equal to $2^{N-k}$, the number of a plurality of ADC k-th Most-Significant-Bit (MSB) saturations is increased by one where k is an integer from 2 to N, and case3: if both absolute values of any pair of the amplitudes of the first signed signal ($I_i$) and the second signed signal ($Q_i$) are smaller than $2^{N-k}$, the number of ADC k-th Most-Significant-Bit (MSB) non-saturations within a total of M pairs of ADC outputs is increased by one where k is an integer from 2 to N.

According to one aspect of the present invention, the step2 further comprises cases of: case1: if there are m Most-Significant-Bit (MSB) saturations out of the plurality of M pairs of the first signed signal ($I_i$) and the second signed signal ($Q_i$), an additional AGC gain adjustment ($\Delta_{Aided}$) from 0 to −30 dB and m is an integer from 0 to M, case2: if there are m k-th Most-Significant-Bit (MSB) saturations out of the plurality of M pairs of the first signed signal ($I_i$) and the second signed signal ($Q_i$), an additional AGC gain adjustment ($\Delta_{Aided}$) can be a real number from −40 to 40 dB, where m is an integer from 0 to M, and k is an integer from 2 to N, and case3: if there are consecutive j sets of the plurality of M pairs of the first signed signal ($I_i$) and the second signed signal ($Q_i$) with m k-th MSB non-saturations, an additional AGC gain adjustment ($\Delta_{Aided}$) is applied, where $\Delta_{Aided}$ is a real number from −40 to 40 dB, j is an integer from 1 to 5, m is an integer from 0 to M, and k is an integer from 2 to N.

To achieve another objective, the present invention provides an automatic gain control (AGC) method using power statistics, comprising steps of: Step1: determining the power statistics including the number of a plurality of ADC Most-Significant-Bit (MSB) power saturations, the number of a plurality of ADC k-th Most-Significant-Bit (MSB) power saturations and the number of ADC k-th Most-Significant-Bit (MSB) power non-saturations within a plurality of M pairs of the first signed signal ($I_i$) and the second signed signal ($Q_i$), Step2: determining an additional AGC gain adjustment ($\Delta_{Aided}$) according to the power statistics obtained in Step1.

According to one aspect of the present invention, the power statistic further comprises cases of: case1: if the sum of squares of any pair of the plurality of M pairs of the first signed signal ($I_i$) and the second signed signal ($Q_i$) is equal to or greater than $2 \times (2^{N-1}-1)$, the number of a plurality of ADC Most-Significant-Bit (MSB) power saturations is increased by one, case2: if the sum of squares of any pair of the plurality of M pairs of the first signed signal ($I_i$) and the second signed signal ($Q_i$) is greater than or equal to $2 \times 2^{2(N-k)}$, the number of a plurality of ADC k-th Most-Significant-Bit (MSB) power saturations is increased by one where k is an integer from 2 to N, and case3: if the sum of squares of any pair of the plurality of M pairs of the first signed signal ($I_i$) and the second signed signal ($Q_i$) is smaller than $2 \times 2^{2(N-k)}$, the number of ADC k-th MSB power non-saturations is increased by one where k is an integer from 2 to N.

According to one aspect of the present invention, the step2 further comprises cases of: case1: if there are m Most-Significant-Bit (MSB) power saturations out of the plurality of M pairs of the first signed signal ($I_i$) and the second signed signal ($Q_i$), an additional AGC gain adjustment ($\Delta_{Aided}$) can be a real number from 0 to –30 dB, where m is an integer from 0 to M, case2: if there are m k-th Most-Significant-Bit (MSB) power saturations out of the plurality of M pairs of the first signed signal ($I_i$) and the second signed signal ($Q_i$), an additional AGC gain adjustment ($\Delta_{Aided}$) can be a real number from –40 to 40 dB, where m is an integer from 0 to M, and k is an integer from 2 to N, and case3: if there are consecutive j sets of the plurality of M pairs of the first signed signal ($I_i$) and the second signed signal ($Q_i$) with m k-th MSB power non-saturations, an additional AGC gain adjustment ($\Delta_{Aided}$) is applied, wherein $\Delta_{Aided}$ is a real number from –40 to 40 dB, j is an integer from 1 to 5, m is an integer from 0 to M, and k is an integer from 2 to N.

To achieve another objective, the present invention provides a wireless communication transceiver with an automatic gain control (AGC) for its receiving mode comprising: an antenna, an antenna switch, a RF receiver, a baseband demodulator. While in receiving mode, the antenna is used for receiving a RF signal. Although a transceiver typically has a transmitter, the antenna switch is positioned such that the RF receiver is connected to the antenna while the transceiver is in receiving mode, and the transmitter is normally turned off. While receiving, the RF receiver electrically connected to the antenna switch is used for providing a first signal and a second signal according to the RF signal. The baseband demodulator electrically connected to the RF receiver is used for providing a LNA and VGA gain control signal to the RF receiver and a demodulated signal.

According to one aspect of the present invention, the RF receiver further comprises: a plurality of stages of low noise amplifier (LNAs), a first plurality of variable gain amplifiers (VGAs), a second plurality of variable gain amplifiers (VGAs). The plurality of stages of low noise amplifier (LNAs) electrically connected to the antenna switch is used for amplifying the RF signal. The first plurality of variable gain amplifiers (VGAs) electrically connected to the plurality of stages of low noise amplifier (LNAs) through a first filter and a first mixer is used for amplifying a first signal output by the first filter and providing a first signal. The second plurality of variable gain amplifiers (VGAs) electrically connected to the plurality of stages of low noise amplifier (LNAs) through a second filter and a second mixer is used for amplifying a second signal output by the second filter and providing a second signal.

According to one aspect of the present invention, the baseband demodulator further comprises: a first N-bit analog-to-digital converter (ADCs), a second N-bit analog-to-digital converter (ADCs), a first analog-to-digital converter, a second analog-to-digital converter, a digital automatic gain control (AGC) module, a baseband demodulator processor. The first N-bit analog-to-digital converter (ADCs) electrically connected to the first plurality of variable gain amplifiers (VGAs) is used for converting the first signal output of the first plurality of variable gain amplifiers (VGAs) into an first unsigned signal. The second N-bit analog-to-digital converter (ADCs) electrically connected to the second plurality of variable gain amplifiers (VGAs) is used for converting the second signal output of the second plurality of variable gain amplifiers (VGAs) into a second unsigned signal. The first analog-to-digital converter electrically connected to the first N-bit analog-to-digital converter (ADCs) is used for converting the first unsigned signal to a first signed signal ($I_i$). The second analog-to-digital converter electrically connected to the second N-bit analog-to-digital converter (ADCs) is used for converting the second unsigned signal to a second signed signal ($Q_i$). The digital automatic gain control (AGC) module electrically connected to the first analog-to-digital converters and the second analog-to-digital converter is used for providing an automatic gain control (AGC) gain setting. The baseband demodulator processor electrically connected to the first analog-to-digital converter and the second analog-to-digital converter is used for processing the first signed signal ($I_i$) and the second signed signal ($Q_i$) and providing a demodulated signal, wherein the digital automatic gain control (AGC) module is the same as the apparatus in claim 1.

These and many other advantages and features of the present invention will be readily apparent to those skilled in the art from the following drawings and detailed descriptions.

BRIEF DESCRIPTION OF THE DRAWINGS

All the objects, advantages, and novel features of the invention will become more apparent from the following detailed descriptions when taken in conjunction with the accompanying drawings.

FIG. 6 shows a first embodiment of the relation of a signed, 3-bit ADC outputs and their powers of the present invention;

FIG. 7 shows a second embodiment of the amplitude and the power statistics of 8 pairs of ADC outputs according to the method of the present invention;

FIG. 8 shows a third embodiment of the amplitude and the power statistics of 16 pairs of ADC outputs according to the method of the present invention.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

Figure 4:
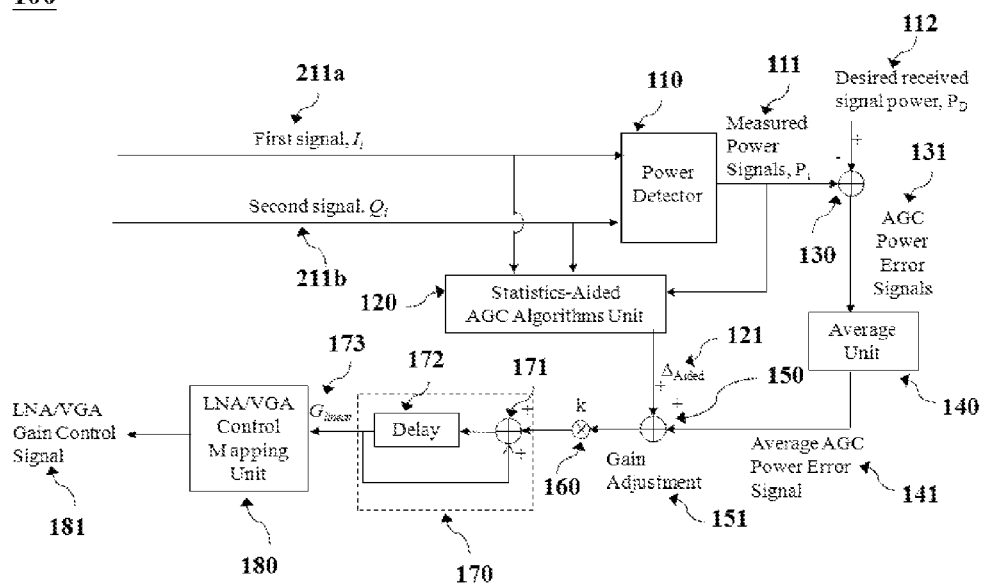
FIG. 4 shows a functional block diagram of the fast and robust automatic gain control (AGC) apparatus of the present invention.

To understand the spirit of the present invention, FIG. 4 shows a functional block diagram of the fast and robust automatic gain control (AGC) apparatus 100 with an additional AGC gain adjustment ($\Delta_{Aided}$) of the present invention, wherein the fast and robust AGC apparatus 100 comprises: a power detector 110, a statistics-aided AGC algorithm unit 120, a subtractor 130, an average unit 140, an adder 150, a multiplier 160, an accumulator 170, a LNA and VGA control mapping unit 180. The first signed signals ($I_i$) 211a and the second signed signals ($Q_i$) 211b are the two inputs to this AGC. The first signed signal ($I_i$) 211a is provided by a first analog-to-digital converter 253. The second signed signal ($Q_i$) 211b is provided by a second analog-to-digital converter 254. The power detector 110, which is electrically connected to the first analog-to-digital converter 253 and the second analog-to-digital converter 254, is used for providing a plurality of measured power ($P_i$) 111, where $P_i$ is equal to the sum of squares of the corresponding first signed signal ($I_i$) 211a and second signed signal ($Q_i$) 211b. The statistics-aided AGC algorithm unit 120, which is electrically connected to the first analog-to-digital converter 253, the second analog-to-digital converter 254 and the power detector 110, is used for determining an additional AGC gain adjustment ($\Delta_{Aided}$) 121 according to the amplitude statistics of the plurality of M pairs of the first signed signal ($I_i$) 211a and the second signed signal ($Q_i$) 211b, and/or the power statistics of the corresponding measured power ($P_i$) 111, where M is an integer from 1 to 100. The subtractor 130, which is electrically connected to the power detector 110, is used for evaluating a power differences between a desired received signal power ($P_D$) 112 and each of the plurality of measured power ($P_i$) 111 and providing a plurality of AGC power error signals 131, wherein the plurality of AGC power error signals 131 are equal to the desired received signal power ($P_D$) 112 minus the plurality of measured power ($P_i$) 111. The average unit 140 electrically connected to the subtractor 130 is used for averaging the same M consecutive AGC power error signals 131 and providing an average AGC power error signal 141. To summarize, for each of the plurality of M pairs of the first signed signal ($I_i$) 211a and the second signed signal ($Q_i$) 211b, an additional AGC gain adjustment ($\Delta_{Aided}$) 121 is generated and is fed to the adder 150, which has the average AGC power error signal 141 as its second input. The adder 150, which is electrically connected to the average unit 140 and the statistics aided AGC algorithm unit 120, generates a corresponding gain adjustment 151 by adding the additional AGC gain adjustment ($\Delta_{Aided}$) 121 to the average AGC power error signal 141. The multiplier 160, which is electrically connected to the adder 150, is used for controlling the AGC loop gain by multiplying the gain adjustment 151 by an adjustable gain (k). The accumulator 170, consisting of an adder 171 and a delay 172, is electrically connected to the multiplier 150. The accumulator 170 takes the gain adjusted plurality of average AGC power error signals 141, adds the gain adjusted plurality of average AGC power error signals 141 up, stores the results and outputs this accumulated value as an appropriate digital gain value ($G_{linear}$) 173. The LNA and VGA control mapping unit 180 electrically connected to the accumulator 170 is used for converting the appropriate digital gain value ($G_{linear}$) 173 into a LNA and VGA gain control signal 181.

The accumulator 170 further comprises: an adder 171 and a delay 172. The adder 171 is electrically connected to the multiplier 160. The delay 172 has an input terminal electrically connected to the adder and an output terminal electrically connected to the adder and the LNA and VGA control mapping unit.

Figure 5:
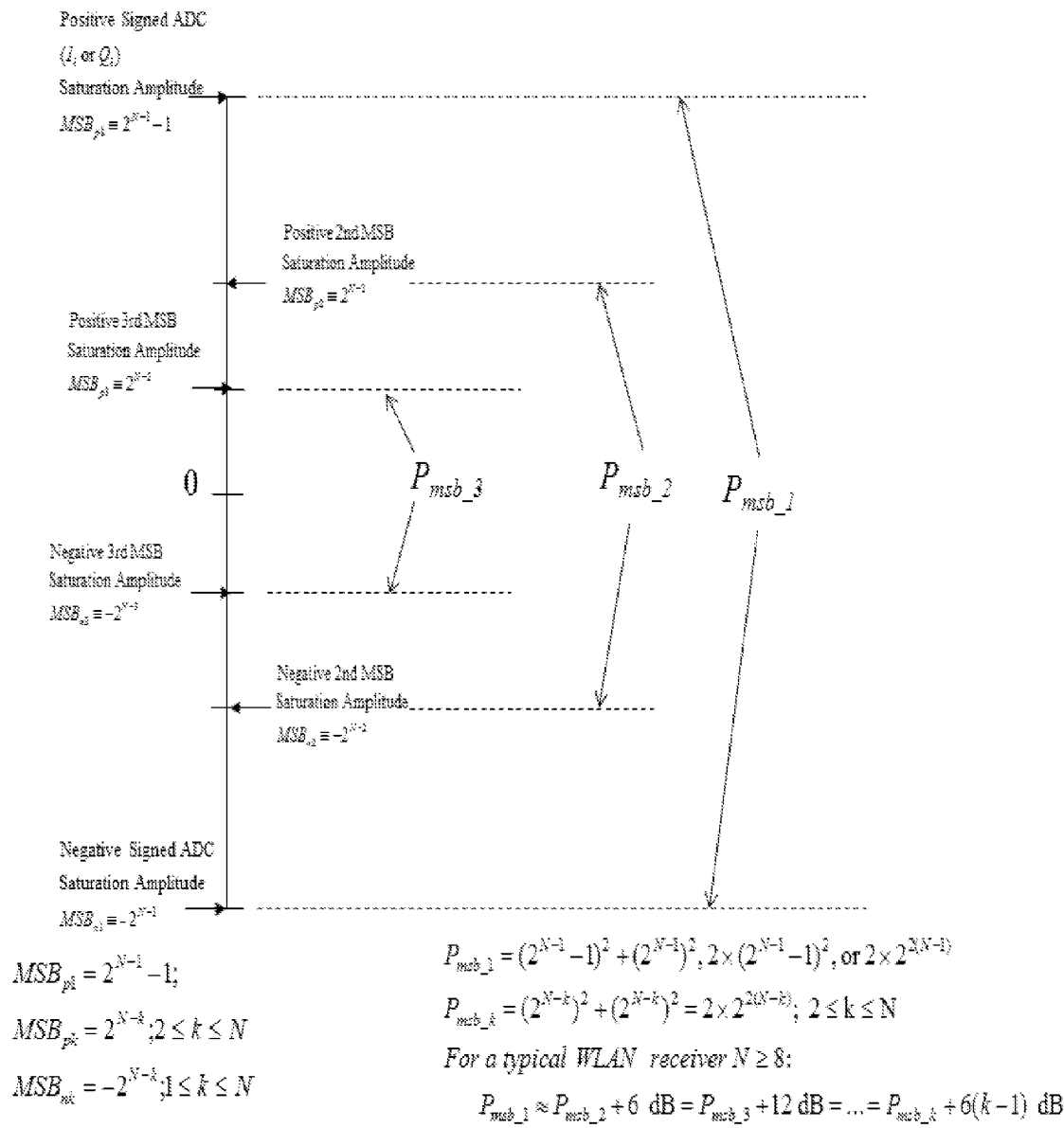
FIG. 5 shows a relation of the first signed signal ($I_i$) and the second signed signal ($Q_i$) and their powers of the present invention.

Based on FIG. 4, FIG. 5 further shows the relations of the first signed signal ($I_i$) 211a and the second signed signal ($Q_i$) 211b and their powers of the present invention. For an N-bit ADC, the signed output, that is, the first signed signal ($I_i$) 211a and the second signed signal ($Q_i$) 211b range is from $-2^{N-1}$ to $2^{N-1}-1$ including zero. Saturation occurs if the first signed signal ($I_i$) 211a or the second signed signal ($Q_i$) 211b is equal to $-2^{N-1}$ or $2^{N-1}-1$ indicating that gain of the fast and robust AGC apparatus 100 is too high and therefore the input signals of N-bit ADCs exceed the maximum ADC dynamic range. In this case, the output signals of N-bit ADCs, which are the inputs to the baseband demodulator processor, will be clipped (distorted) and the system performance is degraded. During the packet acquisition process, while the receiver is trying to detect the presence of a packet and to set gain of the fast and robust apparatus 100 properly, the initial AGC gain is typically set close to its maximum value in the absence of a signal. If the received signal power is 10 dB or more higher than the noise power, saturations are very likely to occur immediately upon the arrival of a packet. However, this is also a useful indication for the fast and robust AGC apparatus 100 to adjust the LNA or VGA gain setting if too many amplitude or power saturations occur in a short observation period from the theory of statistics.

Figure 1:
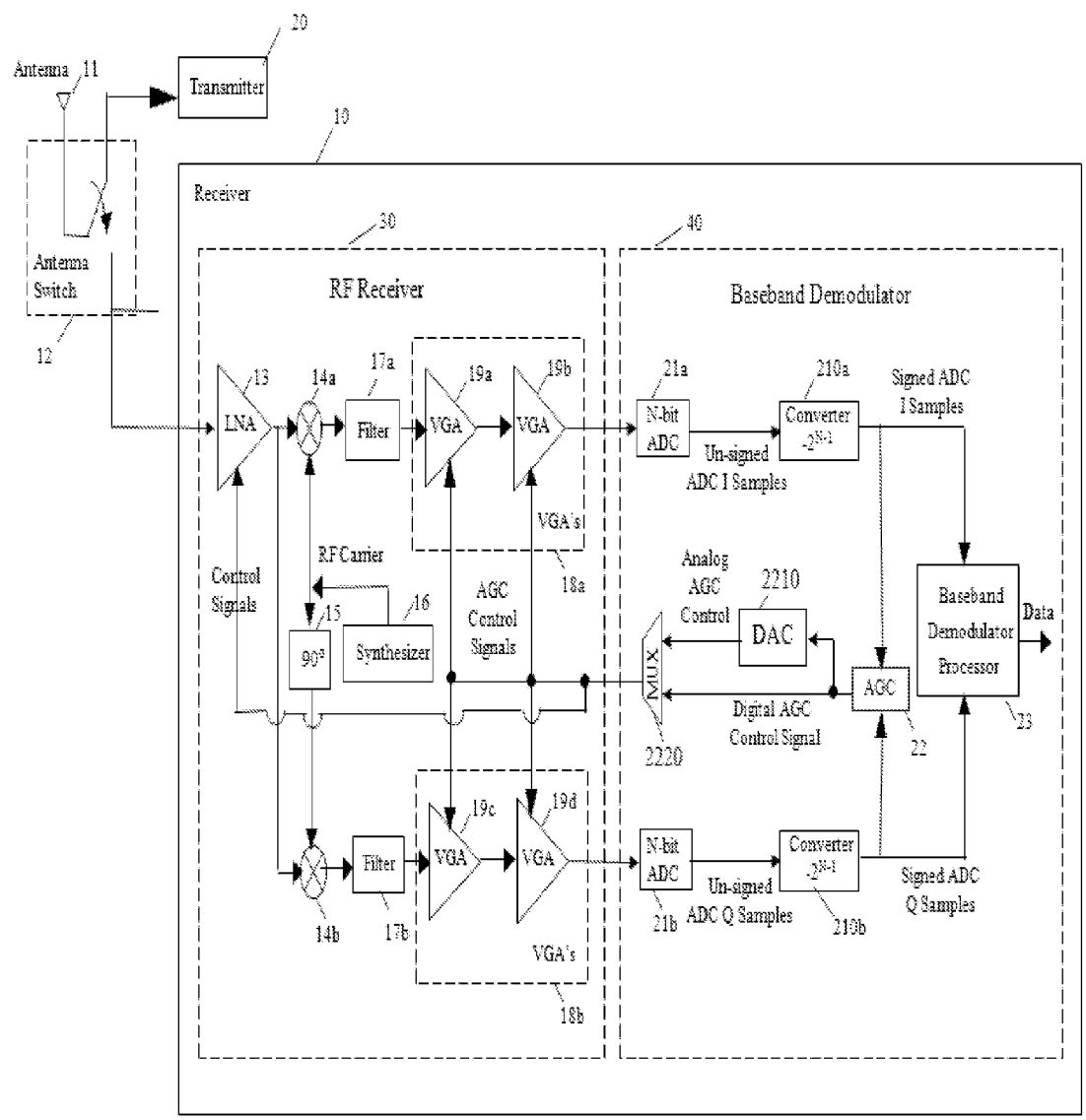
FIG. 1 shows a functional block diagram of a wireless transceiver including a direct down-conversion receiver of the prior art.
Figure 2:
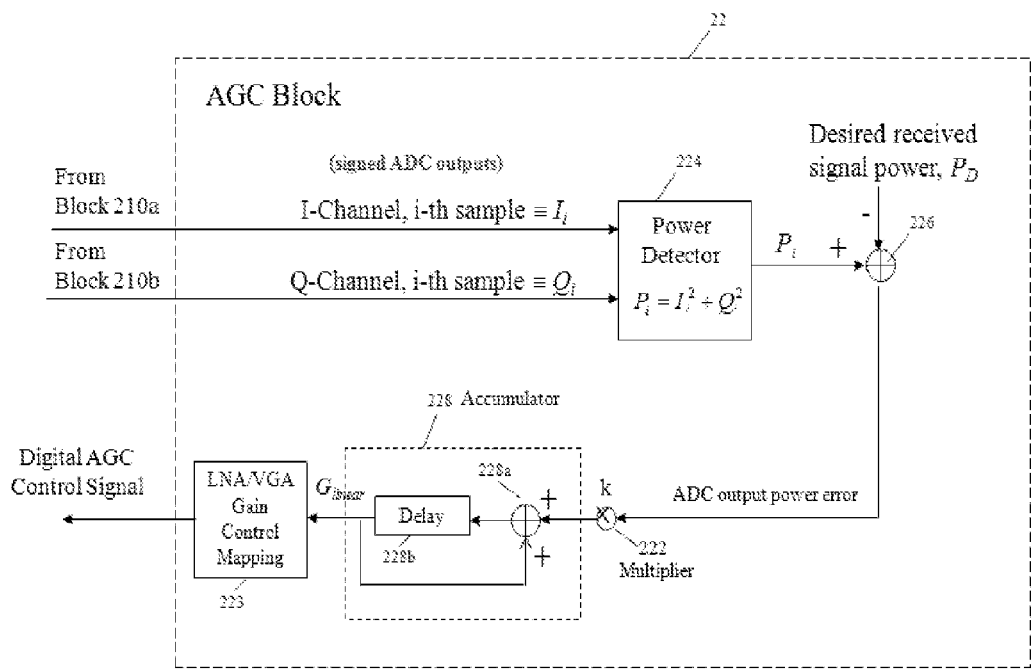
FIG. 2 shows a functional block diagram of a conventional AGC block of the prior art.
Figure 3A:
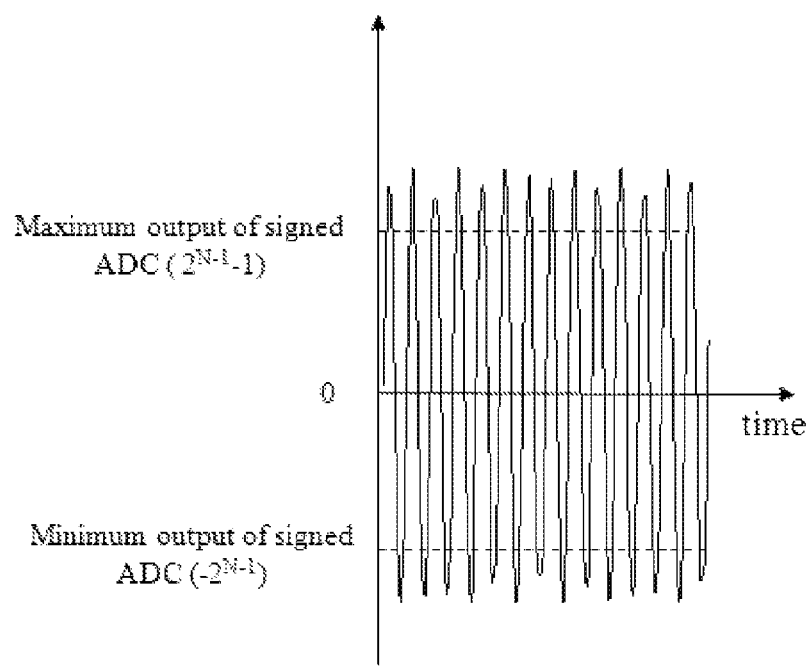
FIG. 3 shows the four cases of signal waveforms relative to their ADC full dynamic ranges of the prior art.
Figure 3B:
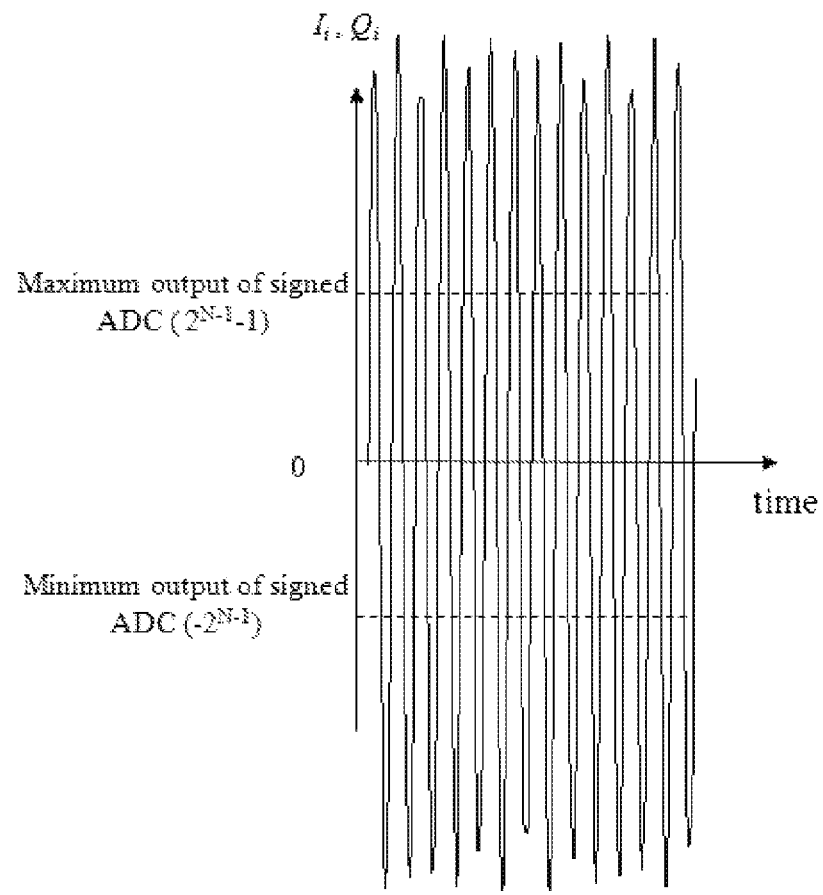
Figure 3C:
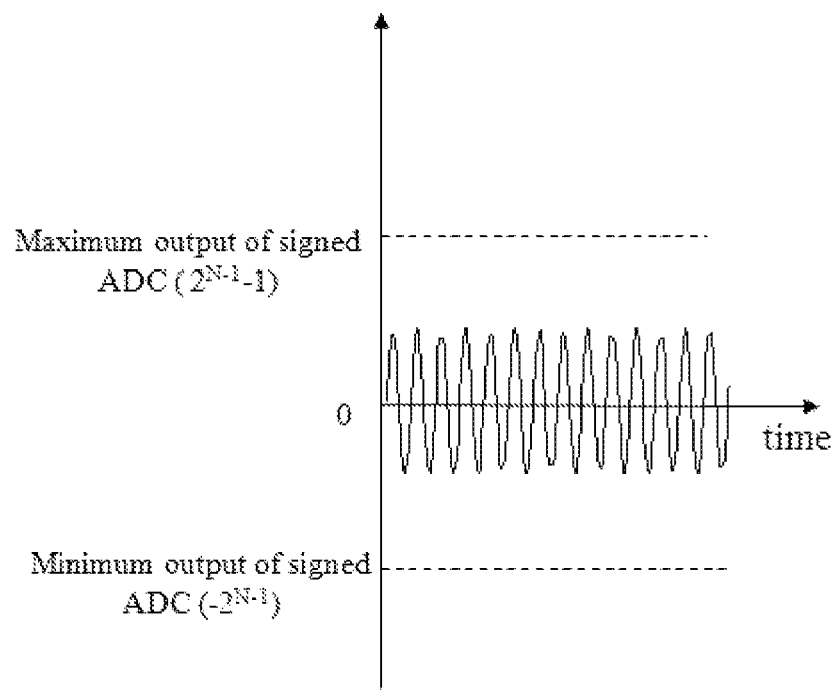
Figure 3D:
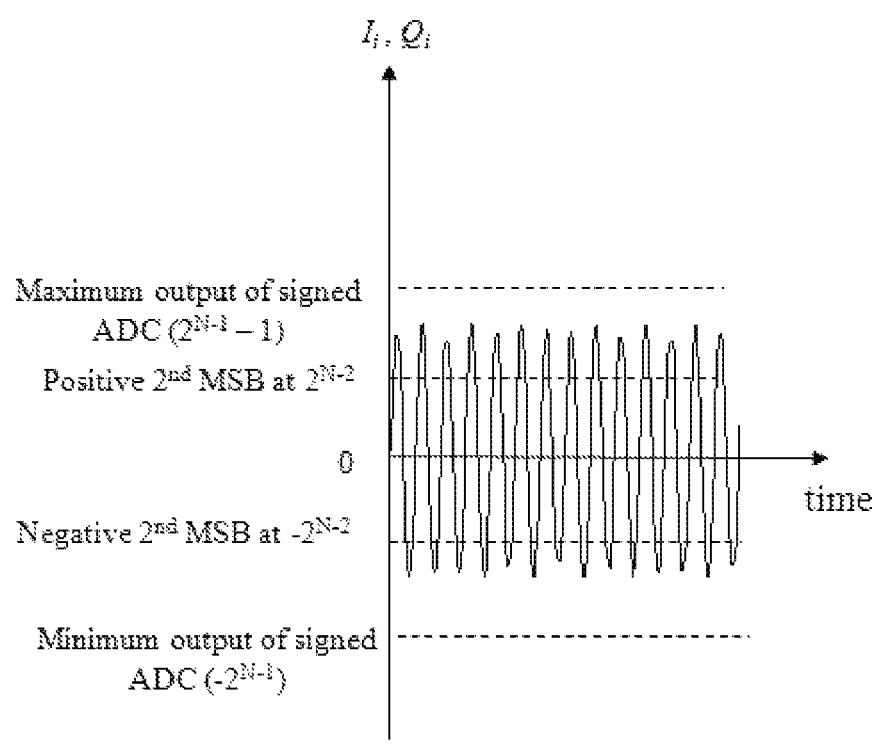

However, if the fast and robust AGC apparatus 100 determines the extra gain only by checking the ADC saturation outputs, that is, the first signed signal ($I_i$) 211a and the second signed signal ($Q_i$) 211b, it is hard to settle the AGC gain in a few microseconds against a received WLAN signal whose dynamic range can be 90 dB (or more). This is because the ADC saturations provide insufficient information in the following cases: (1) when the signal is much bigger (lots of saturated/clipped ADC samples) or (2) when the signal is much smaller in power (far from ADC saturation). In both cases, a traditional AGC algorithm as shown in FIG. 2, operates according to the AGC power error and slowly adjusts the AGC gain. This AGC process could therefore take significant time to converge for the above two cases.

Referring to FIG. 5 again, a useful indication for proper gain setting of the fast and robust AGC apparatus 100 is to compare the power of the first signed signal ($I_i$) 211a and the second signed signal ($Q_i$) 211b, with the "saturations" of the $2^{nd}$ or the $3^{rd}$ MSB. For example, if both samples of a paired ADC I/Q outputs, the first signed signal ($I_i$) 211a and the second signed signal ($Q_i$) 211b, are saturated, the calculated signal power becomes $P_{MSB1}=2\cdot(2^{N-1}-1)^2$, $(2^{N-1}-1)^2 + (2^{N-1})^2)$, or $2\cdot 2^{2(N-1)}$, which is approximately equal to $2\cdot(2^{(N-1)}-1)^2$ for N no smaller than 8. Similarly, if the first signed signal ($I_i$) 211a and the second signed signal ($Q_i$) 211b are one-halves of the ADC dynamic range, the calculated signal power $P_i$ becomes $P_{MSB2}(=2\cdot 2^{2(N-2)})$. One may found that the $P_{MSB1}$ is about four times of $P_{MSB2}$, i.e., 6 dB higher in the power scale. Similarly, a series of reference power and amplitude levels ($P_{MSBk}$, $MSB_{pk}$, and $MSB_{nk}$) with 6 dB resolutions can be obtained as shown in FIG. 5. Specifically, for an N-bit ADC, $P_{MSB1}$ denotes the maximum power of a pair of the first signed signal ($I_i$) 211a and the second signed signal ($Q_i$) 211b, when both samples are equal to positive or negative maximum amplitude, can be one of the following three values: $2 \cdot (2^{N-1}-1)^2$, $(2^{N-1}-1)^2 + (2^{N-1})^2$, or $2 \cdot 2^{2(N-1)}$ In the above, the first maximum power value occurs when both the first signed signal ($I_i$) 211a and the second signed signal ($Q_i$) 211b are $2^{N-1}-1$, the second value occurs when one of the first signed signal ($I_i$) 211a and the second signed signal ($Q_i$) 211b is $2^{N-1}-1$ and another is $-2^{N-1}$, and the third value occurs when both the first signed signal ($I_i$) 211a and the second signed signal ($Q_i$) 211b are $-2^{N-1}$. For WLAN implementations, N is typically no less than 8 and the differences can typically be ignored. Therefore, we will use $P_{msB1}=2 \cdot (2^{N-1}-1)^2$ in all the discussions below. Similarly, $P_{MSB2}=2 \cdot 2^{(N-2)}$ denotes roughly a 6 dB back off in power from $P_{MSB1}$, and $P_{MSB3}=2 \square 2^{(N-3)}$ denotes roughly a 12 dB back off in power from $P_{MSB1}$ As shown in FIG. 5, for an N-bit ADC, $MSB_{p1}$ denotes the "positive" saturation amplitude $2^{N-1}-1$, and $MSB_{n1}$ denotes the "negative" saturation amplitude $-2^{N-1}$ for the first signed signal ($I_i$) 211a and the second signed signal ($Q_i$) 211b. Similarly, $MSB_{pk}$ ($k \geq 2$) denotes the "positive" amplitude of the k-th MSB (Most Significant Bit) $2^{N-k}$ for the first signed signal ($I_i$) 211a and the second signed signal ($Q_i$) 211b, and $MSB_{nk}$ denotes the "negative" amplitude of the k-th MSB $-2^{N-k}$ for the first signed signal ($I_i$) 211a and the second signed signal ($Q_i$) 211b. The equations and arrows in FIG. 5 are used to show the corresponding power of the first signed signal ($I_i$) 211a and the second signed signal ($Q_i$) 211b with the power levels: $P_{MSB1}$, $P_{MSB2}$, and $P_{MSB3}$.

One may select any appropriate power resolution according to the specific application, e.g., 1 dB or a fraction of it. In other words, using the integer number of MSB power saturation/non-saturation is the simplest and intuitive implementation but one skills in the art can set new conditions of changing the gains which are not bounded by the integer bits of k-th MSB saturations/non-saturation, or k-th MSB power saturation/non-saturation as discussed above. For example, a $P_{MSBk.25}=2^{2(N-k-0.25)}$ power saturation/non-saturation is a value in the middle of the k-th and (k+1)th MSB power saturations.

To further understand the operating method of the fast and robust AGC apparatus 100, a method using the amplitude statistics is provided, comprising the steps of: Step1: determining the amplitude statistics including the number of a plurality of ADC Most-Significant-Bit (MSB) saturations, the number of a plurality of ADC k-th Most-Significant-Bit (MSB) saturations and the number of ADC k-th Most-Significant-Bit (MSB) non-saturations within a plurality of M pairs of the first signed signal ($I_i$) 211a and the second signed signal ($Q_i$) 211b, Step2: determining an additional AGC gain adjustment ($\Delta_{Aided}$) 121 according to the amplitude statistics obtained in step1.

The amplitude statistics further comprises cases of: Case1: if the amplitudes of the first signed signal ($I_i$) 211a or the second signed signal ($Q_i$) 211b is equal to $2^{N-1}-1$ or $-2^{N-1}$, the number of a plurality of ADC Most-Significant-Bit (MSB) saturations is increased by one. Case2: if the absolute value of the first signed signal ($I_i$) or the second signed signal ($Q_i$) is greater than or equal to $2^{N-k}$, the number of a plurality of ADC k-th Most-Significant-Bit (MSB) saturations is increased by one, where k is an integer from 2 to N. Case3: if the absolute value of the first signed signal ($I_i$) or the second signed signal ($Q_i$) is smaller than $2^{N-k}$, the number of ADC k-th Most-Significant-Bit (MSB) non-saturations is increased by one, where k is an integer from 2 to N.

Moreover, it also noted that the step2 further comprises cases of: Case1: if there are m Most-Significant-Bit (MSB) saturations out of the plurality of M pairs of the first signed signal ($I_i$) 211a and the second signed signal ($Q_i$) 211b, an additional AGC gain adjustment ($\Delta_{Aided}$) 121 is applied, where $\Delta_{Aided}$ is a real number from 0 to −30 dB, and m is an integer from 0 to M. Case2: if there are m k-th Most-Significant-Bit (MSB) saturations out of a plurality of M pairs of the first signed signal ($I_i$) 211a and the second signed signal ($Q_i$) 211b, an additional AGC gain adjustment ($\Delta_{Aided}$) 121 is applied, where $\Delta_{Aided}$ is a real number from −40 to 40 dB, m is an integer from 0 to M, and k is an integer from 2 to N. Case3: if there are consecutive j sets of the plurality of M pairs of the first signed signal ($I_i$) 211a and the second signed signal ($Q_i$) 211b with m k-the MSB non-saturations, an additional AGC gain adjustment ($\Delta_{Aided}$) is applied, wherein $\Delta_{Aided}$ is a real number from −40 to 40 dB, j is an integer from 1 to 5, m is an integer from 0 to M, and k is an integer from 2 to N.

To further understand the operating method of the fast and robust AGC apparatus 100, a method using the power statistics is provided, comprising steps of: Step1: determining the power statistics including the number of a plurality of ADC Most-Significant-Bit (MSB) power saturations, the number of a plurality of ADC k-th Most-Significant-Bit (MSB) power saturations and the number of ADC k-th Most-Significant-Bit (MSB) power non-saturations within a plurality of M pairs of the first signed signal ($I_i$) 211a and the second signed signal ($Q_i$) 211b. Step2: determining an additional AGC gain adjustment ($\Delta_{Aided}$) 121 according to the power statistics obtained in Step1.

The power statistics further comprise cases of: Case1: if the sum of squares of any pair of the plurality of M pairs of the first signed signal ($I_i$) 211a and the second signed signal ($Q_i$) 211b is equal to or greater than $2 \times (2^{N-1}-1)$, the number of a plurality of ADC Most-Significant-Bit (MSB) power saturations is increased by one. Case2: if the sum of squares of any pair of the plurality of M pairs of the first signed signal ($I_i$) 211a and the second signed signal ($Q_i$) 211b is greater than or equal to $2 \times 2^{2(N-k)}$, the number of a plurality of ADC k-th Most-Significant-Bit (MSB) saturations power is increased by one, where k is an integer from 2 to N. Case3: if the sum of squares of any pair of the plurality of M pairs of the first signed signal ($I_i$) 211a and the second signed signal ($Q_i$) 211b is smaller than $2 \times 2^{2(N-k)}$, the number of ADC k-th MSB power non-saturations is increased by one, where k is an integer from 2 to N.

Moreover, it is also noted that the step2 further comprises cases of: Case1: if there are m Most-Significant-Bit (MSB) power saturations out of the plurality of M pairs of the first signed signal ($I_i$) 211a and the second signed signal ($Q_i$) 211b, an additional AGC gain adjustment ($\Delta_{Aided}$) 121 is applied, where $\Delta_{Aided}$ is a real number from 0 to −30 dB and m is an integer from 0 to M. Case2: if there are m k-th Most-Significant-Bit (MSB) power saturations out of the plurality of M pairs of the first signed signal ($I_i$) 211a and the second signed signal ($Q_i$) 211b, an additional AGC gain adjustment ($\Delta_{Aided}$) 121 is applied, where $\Delta_{Aided}$ is a real number from −40 to 40 dB, m is an integer from 0 to M, and k is an integer from 2 to N. Case3: if there are consecutive j sets of the plurality of M pairs of the first signed signal ($I_i$) 211a and the second signed signal ($Q_i$) 211b with m k-th MSB power non-saturations, an additional AGC gain adjustment ($\Delta_{Aided}$) is applied, wherein $\Delta_{Aided}$ is a real number from −40 to 40 dB, j is an integer from 1 to 5, m is an integer from 0 to M, and k is an integer from 2 to N.

<Embodiment 1>

Referring to FIG. 6, it shows the first embodiment of the relation of a signed, 3-bit ADC outputs and their powers of the present invention. In brief summary, for each pair of the first signed signal ($I_i$) 211a and the second signed signal ($Q_i$) 211b, a few simple power and amplitude indicators for "signal power too high" can be defined as follows, also referring to conditions shown on the right-hand-side of FIG. 6.

(a) Power Indicators:

$$P_{msb\_k\_sat} = \begin{cases} \text{True, if } P_i \geq P_{msb\_k} \\ \text{False, otherwise} \end{cases} \text{ for } 1 \leq k \leq N \quad \text{Eq. (1)}$$

(b) Amplitude Indicators:

$$\text{MSB\_1\_sat} = \begin{cases} \text{True, if}(I_i = MSB_{p1} \text{ or } I_i = MSB_{n1}) \text{ or} \\ (Q_i = MSB_{p1} \text{ or } Q_i = MSB_{n1}) \\ \text{False, otherwise} \end{cases} \quad \text{Eq. (2)}$$

$$\text{MSB\_k\_sat} = \quad \text{Eq. (3)}$$
$$\begin{cases} \text{True, if}(I_i \geq MSB_{pk} \text{ or } I_i \leq MSB_{nk}) \text{ or} \\ (Q_i \geq MSB_{pk} \text{ or } Q_i \leq MSB_{nk}) \quad ; 2 \leq k \leq N \\ \text{False, otherwise} \end{cases}$$

Similarly, FIG. 6 also shows a couple of simple amplitude indicators for "signal power too low".

$$\text{MSB\_k\_null} = \quad \text{Eq. (4)}$$
$$\begin{cases} \text{True, if}(I_i < MSB_{pk} \text{ and } I_i > MSB_{nk}) \text{ and} \\ (Q_i < MSB_{pk} \text{ and } Q_i > MSB_{nk}) \quad ; 1 \leq k \leq N \\ \text{False, otherwise} \end{cases}$$

In the above Eq. (1), a "$P_{msb\_k\_sat}$=true" indicates that the power of this paired signed ADC output is higher than k-th reference power level, $P_{MSBk}$. Similarly, in Eq. (3), a "MSB_k_sat=true" indicates that either $I_i$ or $Q_i$ is greater than $MSK_{pk}$ or less than $MSB_{nk}$. In Eq. (4), MSB_k_null defines a useful indication for the ADC gain being too small. For example, if the desired signal power is set to be $P_{msb\_2}$ (i.e., 6 dB back-off from the maximum power level) but all paired ADC outputs are in the region between $MSB_{p4}$ and $MSB_{n4}$ for a long observation time (consecutive samples) in statistics, the AGC gain is set too low for at least 12 dB.

<Embodiment 2>

Referring to FIG. 7, it shows a second embodiment of the amplitude and the power statistics of 8 pairs of ADC outputs according to the method of the present invention. For each 8 pairs of the first signed signal ($I_i$) 211a and the second signed signal ($Q_i$) 211b, statistics based on simple indicators described in the above are used to check if AGC gain is grossly off. In the first column of FIG. 7, a few conditions (Conditions ($I_i$)-(VI)) showing a clear AGC gain mismatch are given. The corresponding "additional" AGC gain adjustments in dB are shown in the second column. The third column contains the "reasons" why additional gain adjustments are recommended. Specifically, Condition ($I_i$) has 6 out of 8 ($I_i$, $Q_i$) sample pairs with Most-Significant-Bit (MSB) power saturations. The additional AGC gain adjustment is $\Delta_{Aided}$=−15 dB in the second column. And in the third column, a brief reason for the adjustment is given. With a known loop gain in the accumulator 170, the additional AGC gain adjustment ($\Delta_{Aided}$) 121 can be accomplished by properly setting the value of $\Delta_{Aided}$ for the adder 150. Although only six conditions are provided in this embodiment, it is to be reminded that given the simple indicators, one skilled in the art can easily modify the conditions and fine-tune the corresponding additional gain adjustments based on the "peak-to-average power" characteristics of a target receive signal.

The last row of FIG. 7 shows all the dots (" . . . ") as more conditions and corresponding additional AGC gains can be added if so desired.

<Embodiment 3>

Now referring to FIG. 8, it shows a third embodiment of the amplitude and the power statistics of 16 pairs of ADC outputs according to the method of the present invention. For each 16 pairs of the first signed signal ($I_i$) 211a and the second signed signal ($Q_i$) 211b, only statistics based on simple signal "amplitude" indicators described in the above are used to check if AGC gain is grossly off In other words, this embodiment is slightly different from the second embodiment shown in FIG. 7 as simple indicator based on signal power $P_{msb\_k\_sat}$ is not used. In the first column of FIG. 8, a few conditions (Conditions ($I_i$)-(V)) showing a clear AGC gain mismatch are given. In the second column, the corresponding additional AGC gain adjustments are shown. And again in the third column, a brief reason for each condition is given. The last row of FIG. 8 shows all the dots (" . . . ") as more conditions and corresponding additional AGC gains can be added if so desired.

Figure 9:
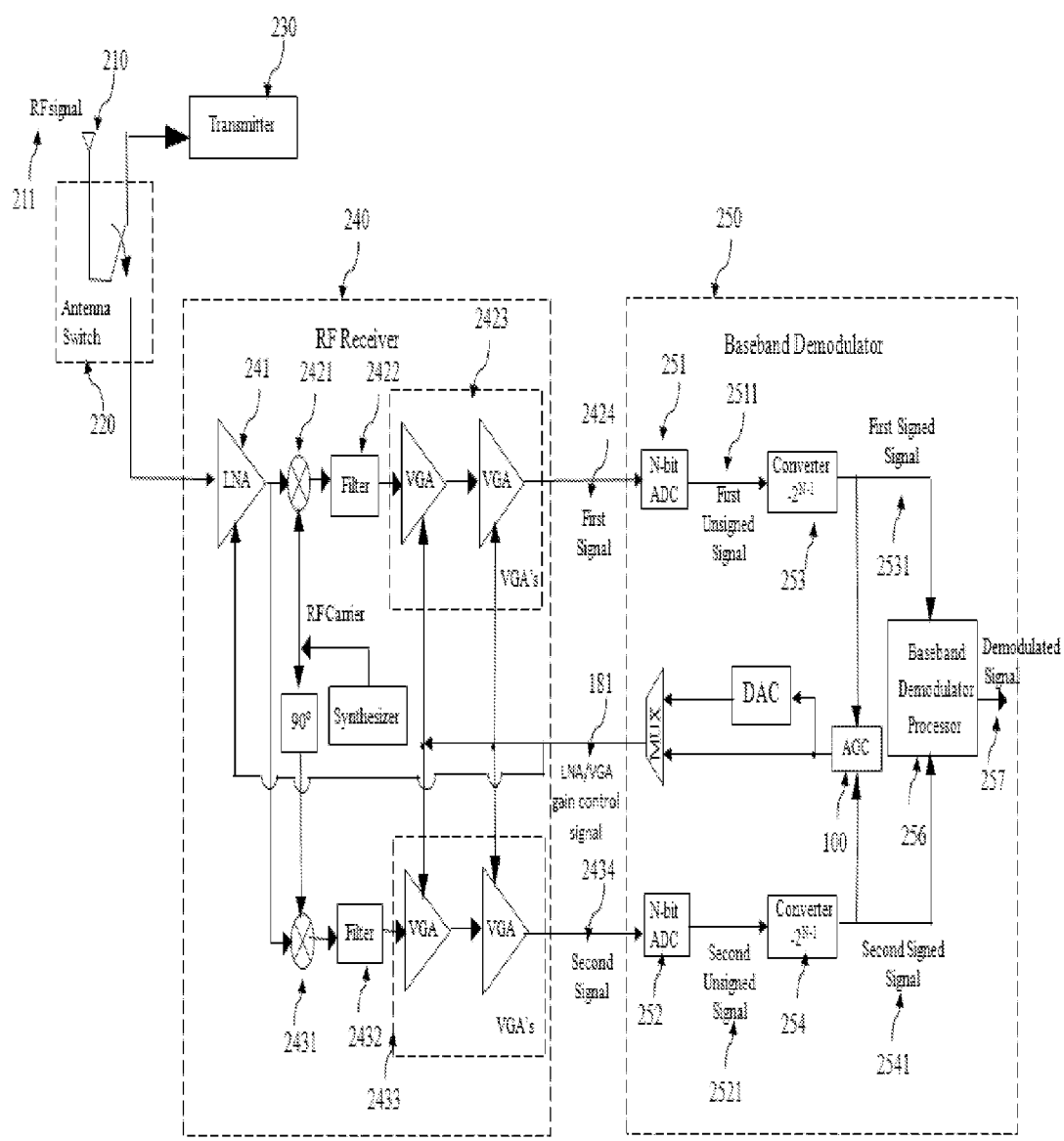
FIG. 9 shows a functional block diagram for a wireless transceiver with an automatic gain control (AGC) of the present invention.

Now referring to FIG. 9, it shows a functional block diagram for a wireless transceiver of the present invention. It provides a wireless communication receiver with a fast and robust automatic gain control (AGC) gain setting, comprising: an antenna 210, an antenna switch 220, a RF receiver 240, a baseband demodulator 250. The antenna 210 is used for receiving and transmitting a RF signal 211. The antenna switch 220 is electrically connected to the antenna 210. While transmitting, the antenna switch 220 position is such that the transmitter 230 is connected to the antenna 210 and the RF receiver 240 is normally turned off to save power. While receiving, the antenna switch 220 is positioned such that the RF receiver 240 is connected to the antenna 210, and the transmitter 230 is normally turned off in order not to interfere with the receiver. While receiving, the RF receiver 240 is used for providing a first signal 2424 and a second signal 2434 according to the RF signal 211 and the LNA and VGA gain control signal 181. The baseband demodulator 250 electrically connected to the RF receiver 240 is used for providing a LNA and VGA gain control signal 181 to the RF receiver 240 and generating a demodulated signal 257.

The RF receiver 240 further comprises: a plurality of stages of low noise amplifier (LNAs) 241, a first plurality of variable gain amplifiers (VGAs) 2423, a second plurality of variable gain amplifiers (VGAs) 2433. The plurality of stages of low noise amplifier (LNAs) 241, which is electrically connected to the antenna switch 220, is used for amplifying the RF signal 211. The first plurality of variable gain amplifiers (VGAs) 2423, which is electrically connected to the plurality of stages of low noise amplifier (LNAs) 241 through a first filter 2422 and a first mixer 2421, is used for providing a first signal 2424. The second plurality of variable gain amplifiers (VGAs) 2433, which is electrically connected to the plurality of stages of low noise amplifier (LNAs) 241 through a second filter 2432 and a second mixer 2431, is used for providing a second signal 2434.

The baseband demodulator 250 further comprises: a first N-bit analog-to-digital converter (ADCs) 251, a second N-bit analog-to-digital converter (ADCs) 252, a first analog-to-digital converter 253, a second analog-to-digital converter 254, a digital automatic gain control (AGC) module 100, a baseband demodulator processor 256. The first N-bit analog-to-digital converter (ADCs) 251 electrically connected to the first plurality of variable gain amplifiers (VGAs) 2423 is used for converting the first signal 2424 output by the first plurality of variable gain amplifiers (VGAs) 2423 into an first unsigned signal 2511. The second N-bit analog-to-digital converter (ADCs) 252 electrically connected to the second plurality of variable gain amplifiers (VGAs) 2433 is used for converting the second signal 2434 output by the second plurality of variable gain amplifiers (VGAs) 2433 into an second unsigned signal 2521. The first analog-to-digital converter 253 electrically connected to the first N-bit analog-to-digital converter (ADCs) 251 is used for converting the first unsigned signal 2511 to a first signed signal ($I_i$) 2531. The second analog-to-digital converter 254 electrically connected to the second N-bit analog-to-digital converter (ADCs) 252 is used for converting the second unsigned signal 2521 to a second signed signal ($Q_i$) 2541. The fast and robust automatic gain control (AGC) module 100, which is electrically connected to the first analog-to-digital converters 253 and the second analog-to-digital converter 254, is used for providing an automatic gain control (AGC) gain setting. The baseband demodulator processor 256, which is electrically connected to the first analog-to-digital converter 253 and the second analog-to-digital converter 254, is used for processing the first signed signal ($I_i$) 2531 and the second signed signal ($Q_i$) 2541 and providing a demodulated signal 257.

The functions and the advantages of the present invention have been shown. Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A fast and robust automatic gain control (AGC) apparatus, comprising:
    a power detector, electrically connected to a first analog-to-digital converter and a second analog-to-digital converter, used for providing a plurality of measured power ($P_i$), wherein $P_i$ is equal to the sum of squares of a first signed signal ($I_i$) provided by the first analog-to-digital converter and a second signed signal ($Q_i$) provided by the second analog-to-digital converter;
    a statistics-aided AGC algorithm unit, electrically connected to the first analog-to-digital converter, the second analog-to-digital converter and the power detector, used for determining an additional AGC gain adjustment ($\Delta_{Aided}$) according to a amplitude statistics of a plurality of M pairs of the first signed signal ($I_i$) and the second signed signal ($Q_i$), or a power statistics of the plurality of measured power ($P_i$), wherein M is an integer from 1 to 100;
    a subtractor, electrically connected to the power detector, used for evaluating a power differences between a desired received signal power ($P_D$) and each of the plurality of measured power ($P_i$) and providing a plurality of AGC power error signals, wherein the plurality of AGC power error signals are equal to the desired received signal power ($P_D$) minus the plurality of measured power ($P_i$);
    an average unit, electrically connected to the subtractor, used for averaging the plurality of AGC power error signals and providing an average AGC power error signal;
    an adder, electrically connected to the average unit and the statistics-aided AGC algorithm unit, used for providing a gain adjustment by adding the additional AGC gain adjustment ($\Delta_{Aided}$) to the average AGC power error signal;
    a multiplier, electrically connected to the adder, used for controlling a AGC loop gain by an adjustable gain (k);
    an accumulator, electrically connected to the multiplier, used for tracking a plurality of average AGC power error, adding the plurality of average AGC power error signals up, storing and providing an appropriate digital gain value ($G_{linear}$); and
    a LNA and VGA control mapping unit, electrically connected to the accumulator, used for converting the appropriate digital gain value ($G_{linear}$) into a LNA and VGA gain control signal.

2. The fast and robust apparatus with an automatic gain control (AGC) gain setting as claimed in claim 1, wherein the accumulator further comprises:
    an adder, electrically connected to the multiplier; and
    a delay, having an input terminal electrically connected to the adder and an output terminal electrically connected to the adder and the LNA and VGA control mapping unit.

3. A method used for providing an automatic gain control (AGC) gain setting by an amplitude statistic, comprising the steps of:
    Step 1: determining an amplitude statistics including a number of a plurality of ADC Most-Significant-Bit (MSB) saturations, a number of a plurality of ADC k-th Most-Significant-Bit (MSB) saturations and a number of an ADC k-th Most-Significant-Bit (MSB) non-saturations within a plurality of M pairs of a first signed signal ($I_i$,) and a second signed signal ($Q_i$) from a plurality of analog to digital converters; and
    Step 2: determining an additional AGC gain adjustment ($\Delta_{Aided}$) according to the amplitude statistics obtained in step 1.

4. The method used for providing an automatic gain control (AGC) gain setting as claimed in claim 3, wherein the step of determining the amplitude statistics further comprises the steps of:
    if the amplitudes of the first signed signal ($I_i$) or the second signed signal ($Q_i$) is equal to $2^{N-1}-1$ or $-2^{N-1}$, increasing the number of the plurality of ADC Most-Significant-Bit (MSB) saturations by one, wherein N is an integer and is greater than 1;
    if the absolute values of the first signed signal ($I_i$) or the second signed signal ($Q_i$) is greater than or equal to $2^{N-k}$, increasing the number of the plurality of ADC k-th Most-Significant-Bit (MSB) saturations by one, where k is an integer from 2 to N; and
    if the absolute values of the first signed signal ($I_i$) or the second signed signal ($Q_i$) is smaller than $2^{N-k}$, increasing the number of the ADC k-th Most-Significant-Bit (MSB) non-saturations by one, where k is an integer from 2 to N.

5. The method used for providing an automatic gain control (AGC) gain setting as claimed in claim 3, wherein the step of determining an additional AGC gain adjustment ($\Delta_{Aided}$) further comprises the steps of:
    if there are m Most-Significant-Bit (MSB) saturations out of the plurality of M pairs of the first signed signal ($I_i$)

and the second signed signal ($Q_i$), applying an additional AGC gain adjustment ($\Delta_{Aided}$), where $\Delta_{Aided}$ is a real number from 0 to −30 dB and m is an integer from 0 to M;

if there are m k-th Most-Significant-Bit (MSB) saturations out of the plurality of M pairs of the first signed signal ($I_i$) and the second signed signal ($Q_i$), applying an additional AGC gain adjustment ($\Delta_{Aided}$), where $\Delta_{Aided}$ is a real number from −40 to 40 dB, m is an integer from 0 to M, and k is an integer from 2 to N; and if there are consecutive j sets of the plurality of M pairs of the first signed signal ($I_i$) and the second signed signal ($Q_i$) with m k-th MSB non-saturations, applying an additional AGC gain adjustment ($\Delta_{Aided}$), where $\Delta_{Aided}$ is a real number from −40 to 40 dB, j is an integer from 1 to 5, m is an integer from 0 to M, and k is an integer from 2 to N.

6. A method used for providing an automatic gain control (AGC) gain setting by a power statistic, comprising the steps of:

Step 1: determining a power statistics including a number of a plurality of ADC Most-Significant-Bit (MSB) power saturations, a number of a plurality of ADC k-th Most-Significant-Bit (MSB) power saturations and a number of ADC k-th Most-Significant-Bit (MSB) power non-saturations within a plurality of M pairs of a first signed signal ($I_i$) and a second signed signal ($Q_i$) from a plurality of analog to digital converters; and Step 2: determining an additional AGC gain adjustment ($\Delta_{Aided}$) according to the power statistics obtained in Step 1.

7. The method used for providing an automatic gain control (AGC) gain setting by a power statistic as claimed in claim 6, wherein the step of determining the power statistics further comprises the steps of:

if the sum of squares of any pair of the plurality of M pairs of the first signed signal ($I_i$) and the second signed signal ($Q_i$) is equal to or greater than $2 \times (2^{N-1}-1)$, increasing the number of the plurality of ADC Most-Significant-Bit (MSB) power saturations by one, wherein N is an integer and is greater than 1;

if the sum of squares of any pair of the plurality of M pairs of the first signed signal ($I_i$) and the second signed signal ($Q_i$) is greater than or equal to $2 \times 2^{2(N-k)}$, increasing the number of the plurality of ADC k-th Most-Significant-Bit (MSB) power saturations by one, where k is an integer from 2 to N; and if the sum of squares of any pair of the plurality of M pairs of the first signed signal ($I_i$) and the second signed signal ($Q_i$) is smaller than $2 \times 2^{2(N-k)}$, increasing the number of ADC k-th Most-Significant-Bit (MSB) power non-saturations by one, where k is an integer from 2 to N.

8. The method used for providing an automatic gain control (AGC) gain setting by a power statistic as claimed in claim 6, wherein the step of determining an additional AGC gain adjustment ($\Delta_{Aided}$) further comprises the steps of:

if there are m Most-Significant-Bit (MSB) power saturations out of the plurality of M pairs of the first signed signal ($I_i$) and the second signed signal ($Q_i$), applying an additional AGC gain adjustment ($\Delta_{Aided}$), where $\Delta_{Aided}$ is a real number from 0 to −30 dB and m is an integer from 0 to M;

if there are m k-th Most-Significant-Bit (MSB) power saturations out of the plurality of M pairs of the first signed signal ($I_i$) and the second signed signal ($Q_i$), applying an additional AGC gain adjustment ($\Delta_{Aided}$), where $\Delta_{Aided}$ is a real number from −40 to 40 dB, m is an integer from 0 to M, and k is an integer from 2 to N; and if there are consecutive j sets of the plurality of M pairs of the first signed signal ($I_i$) and the second signed signal ($Q_i$) with m k-th MSB power non-saturations, applying an additional AGC gain adjustment ($\Delta_{Aided}$), where $\Delta_{Aided}$ is a real number from −40 to 40 dB, j is an integer from 1 to 5, m is an integer from 0 to M, and k is an integer from 2 to N.

9. A wireless communication transceiver with an automatic gain control (AGC), comprising:

an antenna, used for receiving and transmitting a RF signal;

an antenna switch, electrically connected to the antenna and a transmitter;

a RF receiver, electrically connected to the antenna switch, used for providing a first signal and a second signal according to the RF signal; and a baseband demodulator, electrically connected to the RF receiver, used for providing a LNA and VGA gain control signal to the RF receiver and a demodulated signal;

wherein the baseband demodulator further comprises:

a first N-bit analog-to-digital converter (ADCs), electrically connected to a first plurality of variable gain amplifiers (VGAs), used for converting the first signal output by the first plurality of variable gain amplifiers (VGAs) into an first unsigned signal;

a second N-bit analog-to-digital converter (ADCs), electrically connected to a second plurality of variable gain amplifiers (VGAs), used for converting the second signal output by the second plurality of variable gain amplifiers (VGAs) into an second unsigned signal;

a first analog-to-digital converter, electrically connected to the first N-bit analog-to-digital converter (ADCs), used for converting the first unsigned signal to a first signed signal ($I_i$);

a second analog-to-digital converter, electrically connected to the second N-bit analog-to-digital converter (ADCs), used for converting the second unsigned signal to a second signed signal ($Q_i$);

a digital automatic gain control (AGC) module, electrically connected to the first analog-to-digital converters and the second analog-to-digital converter, used for providing an automatic gain control (AGC) gain setting; and a baseband demodulator processor, electrically connected to the first analog-to-digital converter and the second analog-to-digital converter, used for processing the first signed signal ($I_i$) and the second signed signal ($Q_i$) and providing a demodulated signal;

wherein the digital automatic gain control (AGC) module further comprises:

a power detector, electrically connected to the first analog-to-digital converter and the second analog-to-digital converter, used for providing a plurality of measured power ($P_i$) evaluated using a plurality of M pairs of sum of squares of the first signed signal ($I_i$) and the second signed signal ($Q_i$) where M is an integer from 1 to 100;

a statistics-aided AGC algorithm unit, electrically connected to the first analog-to-digital converter, the second analog-to-digital converter and the power detector, used for determining an additional AGC gain adjustment ($\Delta_{Aided}$) according to the first signed signal ($I_i$), the second signed ($Q_i$) and the plurality of measured power ($P_i$) and providing the additional AGC gain adjustment ($\Delta_{Aided}$) according to a power statistic and a amplitude statistic;

a subtractor, electrically connected to the power detector, used for evaluating a power differences between a desired received signal power ($P_D$) and each of the plurality of measured power ($P_i$) and providing a plurality of AGC power error signals;

an average unit, electrically connected to the subtractor, used for averaging the plurality of AGC power error signals and providing an average AGC power error signal;

an adder, electrically connected to the average unit and the statistics-aided AGC algorithm unit, used for providing a gain adjustment by adding the additional AGC gain adjustment ($\Delta_{Aided}$) to the average AGC power error signal;

a multiplier, electrically connected to the adder, used for controlling a AGC loop gain by an adjustable gain (k);

an accumulator, electrically connected to the multiplier, used for tracking the history of accumulations of the average AGC power error signal and providing an appropriate digital gain value ($G_{linear}$); and a LNA and VGA control mapping unit, electrically connected to the accumulator, used for converting the appropriate digital gain value ($G_{linear}$) into a LNA and VGA gain control signal.

10. The wireless communication receiver with an automatic gain control (AGC) as claimed in claim 9, wherein the RF receiver further comprises:

a plurality of stages of low noise amplifier (LNAs), electrically connected to the antenna switch, used for amplifying the RF signal;

a first plurality of variable gain amplifiers (VGAs), electrically connected to the plurality of stages of low noise amplifier (LNAs) through a first filter and a first mixer, used for providing a first signal; and a second plurality of variable gain amplifiers (VGAs), electrically connected to the plurality of stages of low noise amplifier (LNAs) through a second filter and a second mixer, used for providing a second signal.

11. The wireless communication receiver with an automatic gain control (AGC) as claimed in claim 9, wherein the accumulator further comprises:

an adder, electrically connected to the multiplier; and a delay, having an input terminal electrically connected to the adder and an output terminal electrically connected to the adder and the LNA and VGA control mapping unit.

* * * * *